United States Patent
Choi et al.

(10) Patent No.: US 6,295,223 B1
(45) Date of Patent: Sep. 25, 2001

(54) FERROELECTRIC RANDOM ACCESS MEMORY WITH A MEMORY WITH A STABLE SENSING MARGIN

(75) Inventors: Mun-Kyu Choi; Byung-Gil Jeon, both of Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/559,843

(22) Filed: Apr. 26, 2000

(30) Foreign Application Priority Data

Apr. 27, 1999 (KR) .................................................. 99-15074

(51) Int. Cl.[7] .................................................. G11C 11/22
(52) U.S. Cl. .......................... 365/145; 365/205; 365/207
(58) Field of Search .................................... 365/145, 205, 365/207, 203

(56) References Cited

U.S. PATENT DOCUMENTS

| 4,893,272 | * | 1/1990 | Eaton, Jr. et al. | 365/145 |
| 5,432,731 | * | 7/1995 | Kirsch | 365/145 |
| 6,055,200 | * | 4/2000 | Choi et al. | 365/201 |
| 6,111,777 | * | 8/2000 | Ogiwara et al. | 365/145 |

* cited by examiner

Primary Examiner—Amir Zarabian
Assistant Examiner—Hien Nguyen
(74) Attorney, Agent, or Firm—Marger Johnson & McCollom, P.C.

(57) ABSTRACT

Disclosed is a ferroelectric random access memory having a reference voltage supplying circuit with a capacitor coupling structure. The reference voltage supplying circuit including a coupling capacitor and switching transistors configured on the basis of the capacitor coupling structure. According to the reference voltage supplying circuit of the present invention, voltages on bit lines coupled to a ferroelectric memory cell and to the reference voltage supplying circuit, respectively, are simultaneously activated. Therefore, a stable sensing margin can be secured even though power noise arises during the read operation.

15 Claims, 5 Drawing Sheets

| Fig. 3A | Fig. 3B |

# FERROELECTRIC RANDOM ACCESS MEMORY WITH A MEMORY WITH A STABLE SENSING MARGIN

FIELD OF THE INVENTION

The present invention relates to integrated circuit memory devices and, more particularly, to a ferroelectric random access memory device having a stable sensing margin.

BACKGROUND OF THE INVENTION

A ferroelectric random access memory uses a ferroelectric capacitor as the storage element of each memory cell. Each memory cell stores a logic state based on the electrical polarization state of the ferroelectric capacitor. The ferroelectric capacitor has a dielectric between its electrodes that comprises a ferroelectric material such as lead zirconate titanate (PZT). When a voltage is applied to the plates of the ferroelectric capacitor, the ferroelectric material is polarized in the direction of the electric field. The switching threshold for changing the polarization state of the ferroelectric capacitor is defined as the coercive voltage. The ferroelectric capacitor exhibits hysteresis and the flow of current to the capacitor depends on its polarization state. If the voltage applied to the capacitor is greater than its coercive voltage, then the ferroelectric capacitor may change polarization states depending on the polarity of the applied voltage. The polarization state is retained after power is removed, thereby providing nonvolatility. The ferroelectric capacitor can be switched between polarization states vary rapidly in about one nanosecond, which is faster than the programming time of most other nonvolatile memories such as Erasable Programmable Read Only Memories, (EPROMs), Electrically Erasable Programmable Read Only Memories (EEPROMs), or flash EEPROMs.

Data stored in a memory cell having a ferroelectric capacitor is read out as follows. First, a voltage is applied across both electrodes of the ferroelectric capacitor. The difference in charges induced on the bit line coupled to the memory cell is sensed. In order to do so, a circuit is needed that generates a reference voltage having a middle value between a voltage corresponding to data '1' and a voltage corresponding to data '0'. Generally, the reference voltage is produced by use of a reference cell that includes a ferroelectric capacitor having the same properties as the ferroelectric capacitor of the memory cell.

A major problem in sensing the polarization state of the ferroelectric capacitor in the memory cell is that the electric field/polarization characteristic loop (hysteresis curve) of the ferroelectric capacitor changes over time due to aging from use or due to aging from being left in a polarization sense for an extended time. Generally, the change in polarization properties with time, results in a collapsing of the hysteresis curve. This is a basic material phenomenon which is due to a non-reversibility in at least a portion of the volume of the ferroelectric material under electric field/polarization cycling. This changing of the ferroelectric material makes it very difficult to use a reference cell to determine the polarization state of the ferroelectric memory cell.

U.S. Pat. No. 5,432,731, entitled FERROELECTRIC MEMORY CELL AND METHOD OF SENSING AND WRITING THE POLARIZATION STATE THEREOF, describes one approach for overcoming the above-described problem. The simplified one capacitor ferroelectric memory cell with reference cell disclosed in the '731 patent is illustrated in FIG. 1. The '731 patent discloses a reference cell 12 having a first switching transistor 35, a second switching transistor 37, and a reference capacitor 39. The gate of the first switching transistor 35 is connected to a REF WORD line 40 and the source is connected to a BITC line 25. One plate of the reference capacitor 39 is connected to ground and the other plate is connected to the drain of the first switching transistor 35 and to the source of the second switching transistor 37. The drain of the switching transistor 37 is connected to a reference potential REF INIT and the gate is connected to receive a reference initialize signal.

The reference cell 12 of the '731 patent is configured such that the bit line BITC is supplied with the reference voltage in accordance with a voltage dumping structure. Such a voltage dumping structure has the following disadvantage. When no power noise is generated during a read operation, the margin between voltages $V_{BIT}$ and $V_{BITC}$ on the bit lines BIT and BITC, that is, the sensing margin, may remain constant as shown in FIG. 2. On the other hand, when power noise is generated during the read operation, the voltages $V_{BIT}$ and $V_{BITC}$ on the bit lines BIT and BITC change due to the power noise. However, as illustrated in FIG. 2, the bit line BIT may be affected by the power noise faster than the bit line BITC. This is because the voltage on the bit line BIT changes due to a capacitor coupling structure and the voltage on the bit line BITC changes due to a voltage dumping structure. After the reference potential REF INIT is charged on the reference capacitor 39, the voltage thus charged is dumped on the bit line BITC in accordance with the voltage dumping structure. The charge dumping makes the voltage change on the bit lines BIT and BITC due to the power noise appear differently in time from each other. When the power noise arises during the read operation, as illustrated in FIG. 2, the sensing margin between the bit lines BIT and BITC is reduced. A reduction in sensing margin causes read operation failures.

SUMMARY OF THE INVENTION

It is therefore an object of the present invention to provide a ferroelectric random access memory device capable of securing a stable sensing margin even when power noise is present.

In order to attain the above objects, there is provided a ferroelectric random access memory in which a memory cell is formed at an intersection of a word line and a first bit line, a sense amplifier is coupled between the first bit line and a second bit line, and a reference voltage supplying circuit supplies the second bit line with a reference voltage. The reference voltage supplying circuit is configured such that the reference voltage is supplied on the second bit line by using a capacitor coupling scheme. In particular, the reference voltage supplying circuit comprise a coupling capacitor, a first switching device for connecting the second bit line to a first plate of the coupling capacitor responsive to a first switching control signal, and a second switching device for connecting a second plate of the coupling capacitor to a first power node receiving a power supply voltage responsive to a second switching control signal. In order to prevent the coupling capacitor from floating, the first switching control signal is activated prior to the second switching control signal.

A plate line and plate line driver are further provided. The plate line is arranged to correspond to the word line. The plate line driver is coupled to the plate line and a second power node receiving the power supply voltage and drives the plate line responsive to a plate line driving signal. Particularly, the first and second power nodes are electrically connected to each other in as short a distance as possible.

According to the above-described reference voltage supplying circuit of the present invention, voltages on the first and second bit lines and the plate line are simultaneously activated when power noise arises. Therefore, a stable sensing margin between the first and second bit lines can be secured in spite of the presence of power noise.

BRIEF DESCRIPTION OF THE DRAWINGS

The foregoing and other objects, features, and advantages of the invention will become more readily apparent from the following detailed description of a preferred embodiment that proceeds with reference to the following drawings.

DESCRIPTION OF THE PREFERRED EMBODIMENT

Figure 1:
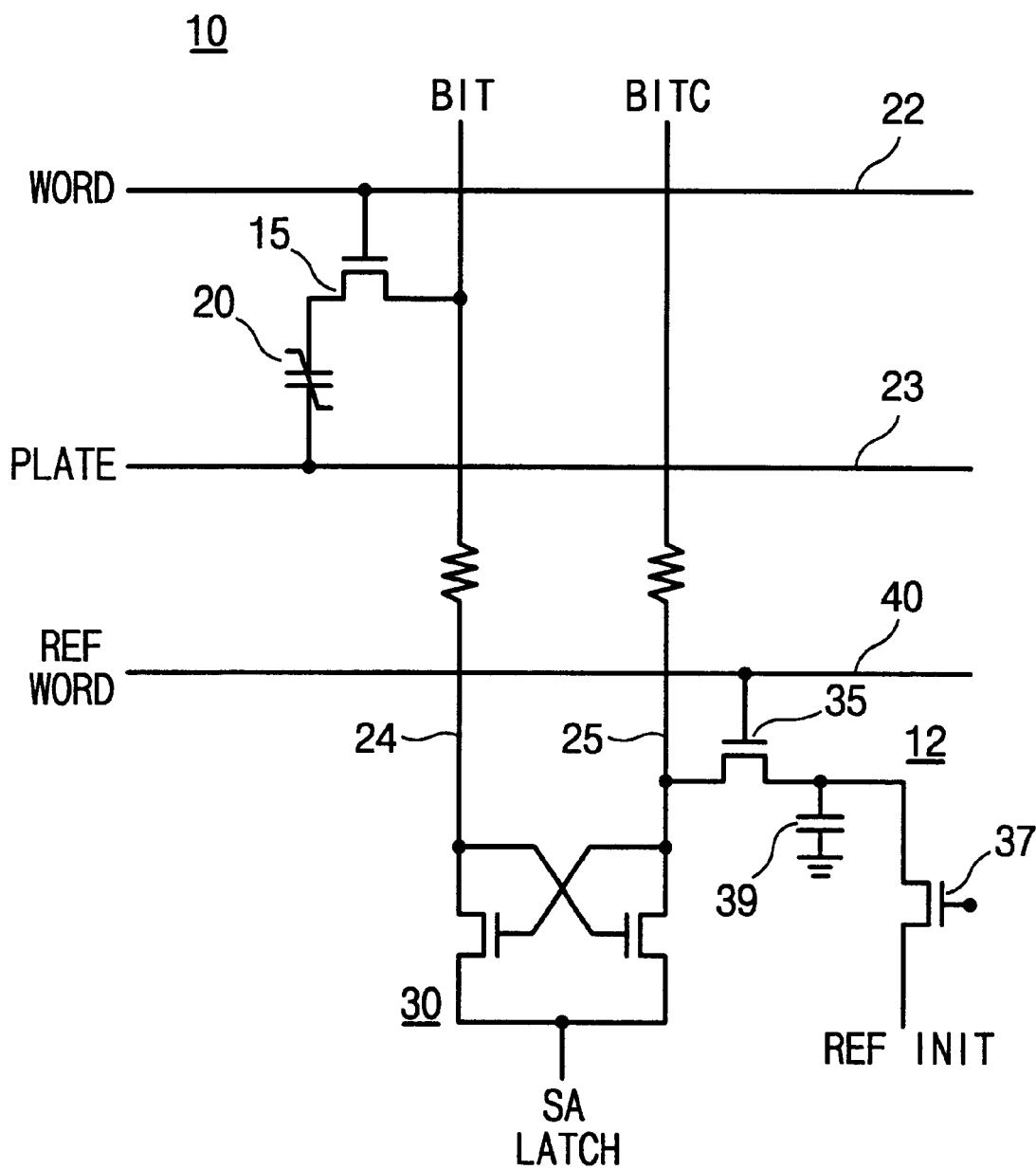
FIG. 1 is a circuit diagram of a simplified one capacitor ferroelectric memory cell with reference cell according to the prior art.
Figure 2:
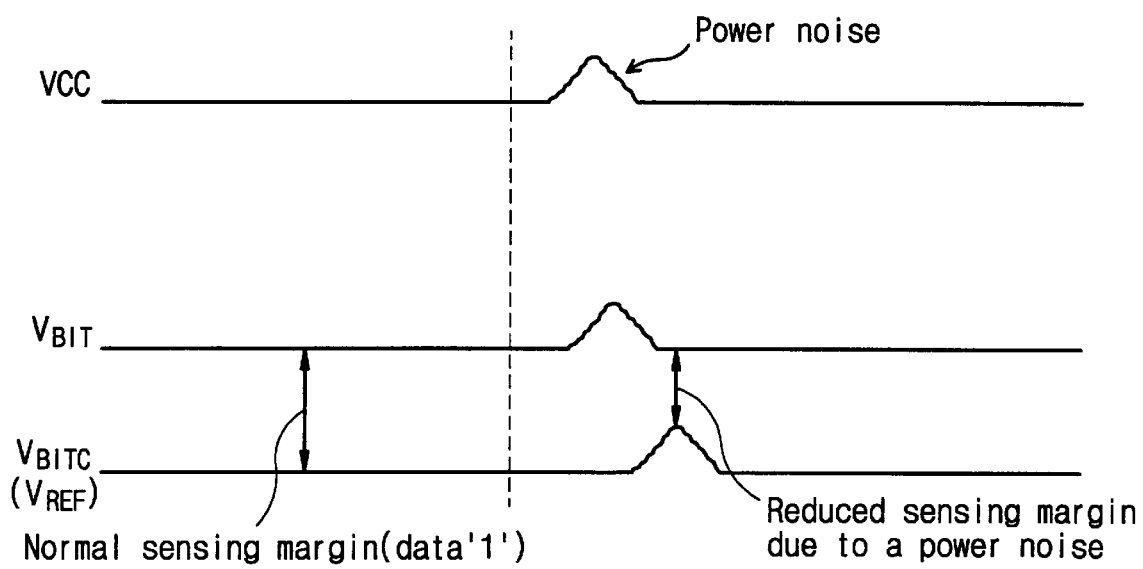
FIG. 2 is a diagram for comparing a normal sensing margin with a reduced sensing margin due to a power noise.
Figures 3, 3A:
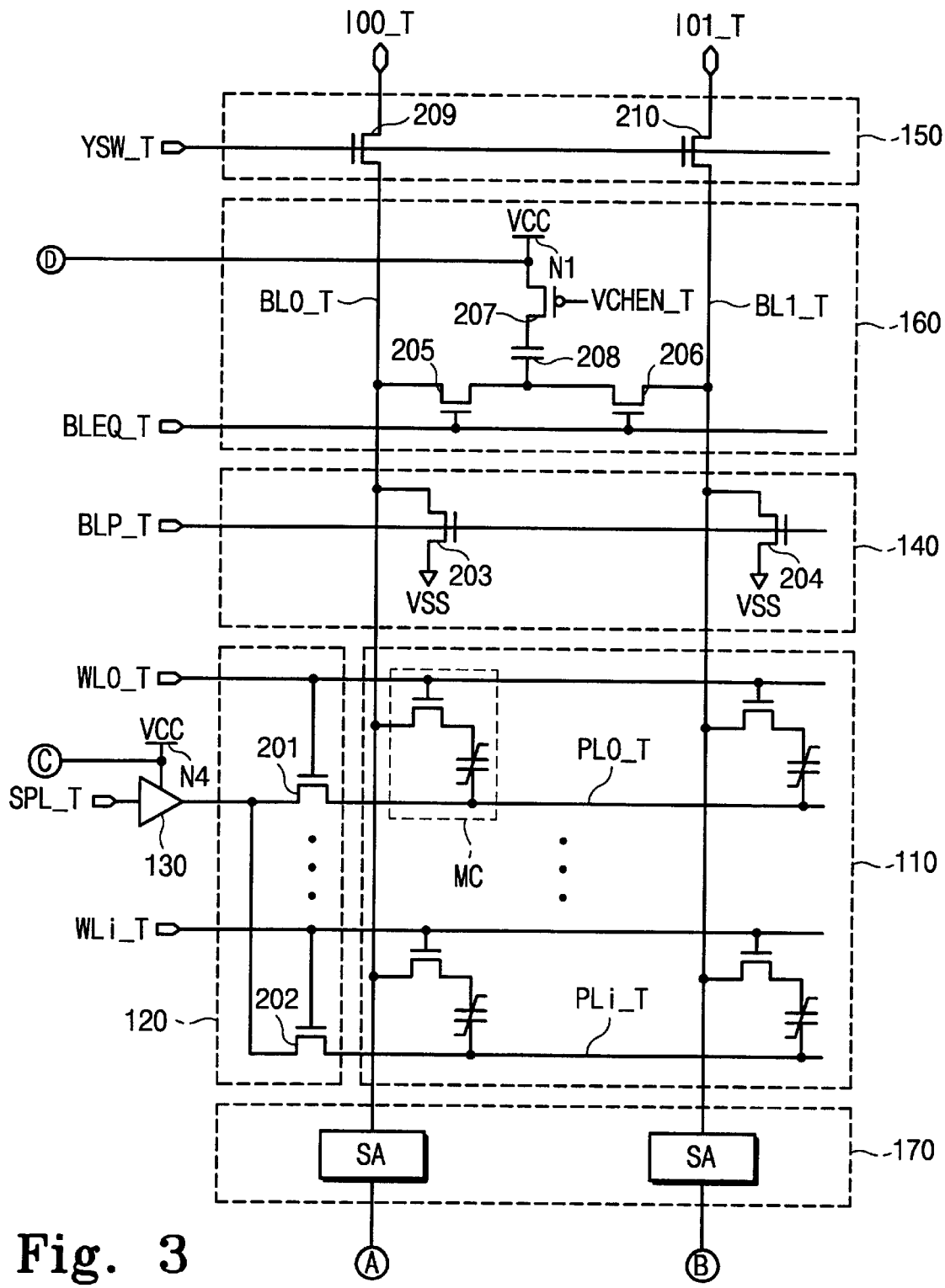
FIGS. 3A–3B are circuit diagrams of a ferroelectric random access memory according to a preferred embodiment of the present invention.
Figure 3B:
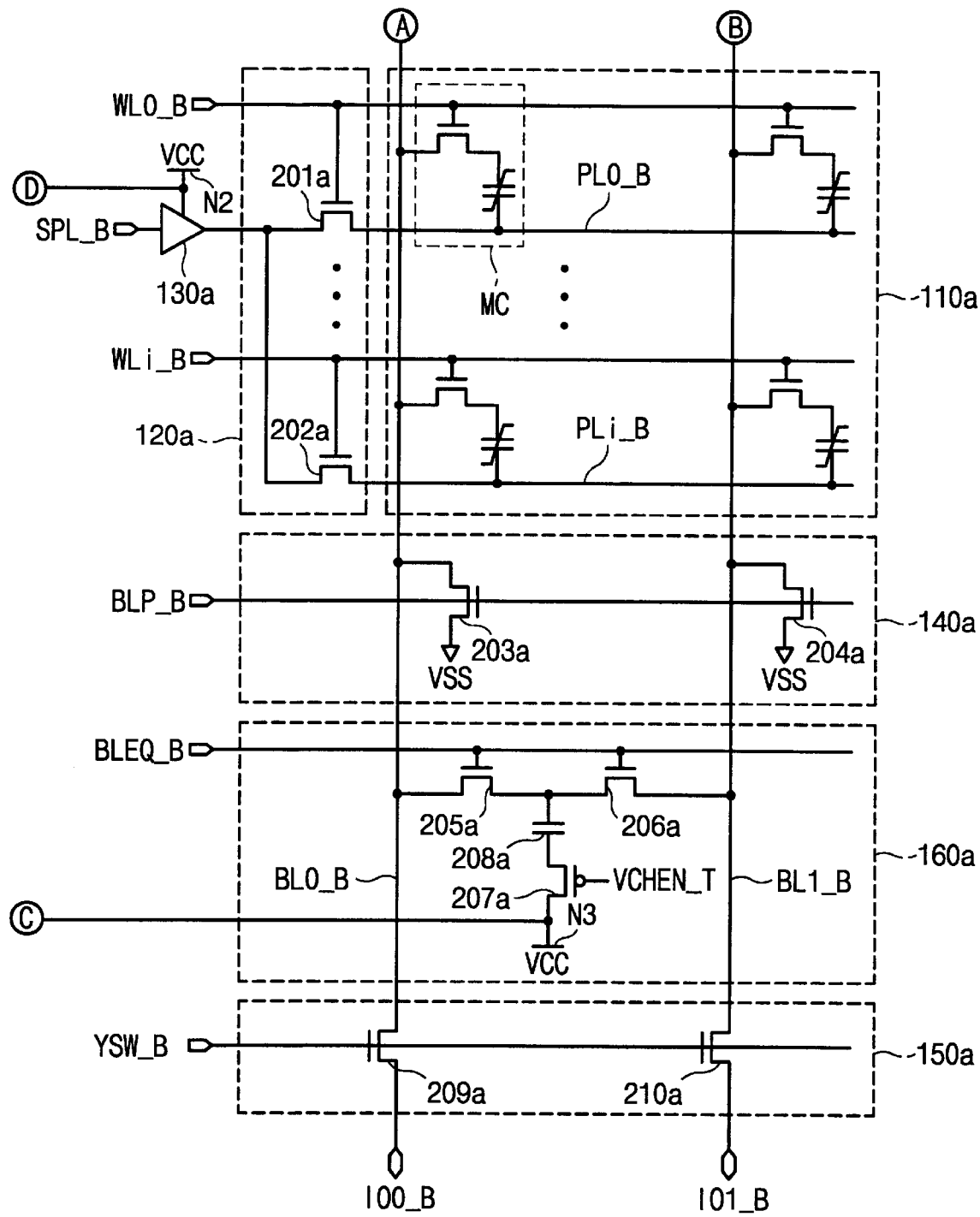

FIGS. 3A–3B are circuit diagrams of a ferroelectric random access memory according to the present invention. Referring to FIGS. 3A–3B, the ferroelectric random access memory comprises a first memory cell array 110 having a plurality of memory cells MC arranged in rows and columns. A plurality of first word lines WL0_T to WLi_T are arranged in the rows through the first memory cell array 110. Each of the first word lines WL0_T to WLi_T is commonly coupled to the memory cells MC of a corresponding row in the first memory cell array 110. A plurality of first plate lines PL0_T to PLi_T are arranged in the rows so as to correspond to the first word lines WL0_T to WLi_T.

Each of the memory cells MC comprises a ferroelectric capacitor and an access transistor. The ferroelectric capacitor has a first plate coupled to a corresponding first plate line (for example, PL0_T). The access transistor has a gate coupled to a corresponding word line (for example, WL0_T) and a current path formed between a corresponding bit line (for example, BL0_T) and the second plate of the ferroelectric capacitor.

The first plate lines PL0_T to PLi_T are connected to a first plate line selecting circuit 120, which selects one of the first plate lines PL0_T to PLi_T responsive to first word line driving signals on the first word lines WL0_T to WLi_T. The first plate line selecting circuit 120 comprises a plurality of field effect transistors, that is, NMOS transistors 201, . . . , 202, each of which has a gate coupled to a corresponding first word line, and a current path coupled between a first plate line driver 130 and a corresponding first plate line. The first plate line driver 130 drives the selected first plate line responsive to a first plate line driving signal SPL_T.

The ferroelectric random access memory further comprises a first bit line precharge circuit 140 for precharging the first bit lines BL0_T and BL1_T at a predetermined voltage, for example, a ground voltage VSS, responsive to a first precharge signal BLP_T. The first bit line precharge circuit 140 comprises a plurality of NMOS transistors 203 and 204, each of which has a gate coupled to the first precharge signal BLP_T and a current path formed between a corresponding first bit line and a ground VSS. The first bit lines BL0_T and BL1_T are coupled at a first end with corresponding input/output (IO) lines IO0_T and IO1_T through a first 10 gate circuit 150. The first bit lines BL0_T and BL1_T are coupled at a second end to a sense amplifier circuit 170 comprising a plurality of sense amplifiers SA corresponding to the first bit lines BL0_T and BL1_T.

A pair of the first bit lines BL0_T and BL1_T corresponding to two columns, are illustrated in FIG. 3. However, it should obvious to one skilled in the art that the circuit of FIGS. 3A–3B can support a larger number of first bit lines in a row direction without deviating from the scope of the invention.

A first reference voltage supplying circuit 160 is provided which responds to switching control signals BLEQ_T and VCHEN_T during a read operation and supplies the first bit lines BL0_T and BL1_T with a reference voltage.

As illustrated in FIG. 3A, the first reference voltage supplying circuit 160 comprises first and second NMOS transistors (each acting as a switching device) 205 and 206, a PMOS transistor 207 and a coupling capacitor 208. The coupling capacitor 208 has a dielectric between its electrodes that comprise a paraelectric material. The first NMOS transistor 205 connects the first bit line BL0_T to one plate of the coupling capacitor 208 responsive to the switching control signal BLEQ_T. The second NMOS transistor 206 connects the first bit line BL1_T to the one plate of the coupling capacitor 208 responsive to the switching control signal BLEQ_T. The PMOS transistor 207 connects the other plate of the coupling capacitor 208 to a power supply voltage VCC responsive to the switching control signal VCHEN_T. The first and second NMOS transistors 205 and 206 shown in FIG. 3A act as a bit line equalizer responsive to the switching control signal BLEQ_T.

The ferroelectric random access memory of the present invention further comprises a plurality of second word lines WL0_B to WLi_B, a plurality of second plate lines PL0_B to PLi_B corresponding to the plurality of second word lines WL0_B to WLi_B, a plurality of second bit lines BL0_B and BL1_B corresponding to the plurality of first bit lines BL0_T and BL1_T, a second memory cell array 110a, a second plate line selecting circuit 120a, a second plate line drive 130a, a second bit line precharge circuit 140a, a second IO gate circuit 150a, and a second reference voltage supplying circuit 160a. The constituent elements 110a, 120a, 130a, 140a, 150a, and 160a are arranged at a lower side of the sense amplifier circuit 170 and have the same configuration as elements 110, 120, 130, 140, 150, and 160 arranged at an upper side of the sense amplifier circuit 170, description thereof is omitted.

The first and second reference voltage supplying circuits 160 and 160a have "a capacitor coupling structure" instead of "the voltage dumping structure" of the prior art. In order to obtain a coupling effect, one plate of the coupling capacitor 208/208a is not allowed to float. For this reason, the timing between the switching control signals BLEQ_T/B and VCHEN_T/B has to be controlled such that the switching control signal VCHEN_T/B is activated after the switching control signal BLEQ_T/B.

Furthermore, according to the present invention, as seen in FIGS. 3A and 3B, a power node N1 for receiving the power supply voltage VCC in the first reference voltage supplying circuit 160 is electrically connected to a power node N2 for receiving the power supply voltage VCC in the second plate line driver 130a. In particular, the power nodes N1 and N2 are electrically coupled to each other in as short a distance as possible. Similarly, a power node N3 for receiving the power supply voltage VCC in the second reference voltage supplying circuit 160a is connected to a power node N4 for receiving the power supply voltage VCC in the first plate line driver 130. In particular, the power nodes N3 and N4 are coupled to each other in as short a distance as possible.

According to the reference voltage supplying circuit utilizing "the capacitor coupling structure," when a power noise arises during the read operation, the voltages on the bit lines (for example, BL0_T and BL0_B) are simultaneously changed. This is because the first and second reference voltage supplying circuits 160 and 160a are configured so as to have the same structure as the memory cell having a capacitor coupling scheme. As a result, the voltages on the bit lines (for example, BL0_T and BL0_B) are simultaneously affected by the power noise. This means that a stable sensing margin is secured regardless of the power noise. Furthermore, this effect can be multiplied by electrically linking the corresponding power nodes N1–N2 and N3–N4 in as short a distance as possible.

In the above-described ferroelectric random access memory, in the case where data is read out from the first memory cell array 110, the first memory cell array 110 and the second reference voltage supplying circuit 160a are selected, while the second memory cell array 110a and the first reference voltage supplying circuit 160 are deselected. In the case where data is read out from the second memory cell array 110a, the second memory cell array 110a and the first reference voltage supplying circuit 160 are selected, while the first memory cell array 110 and the second reference voltage supplying circuit 160a are deselected.

Figure 4:
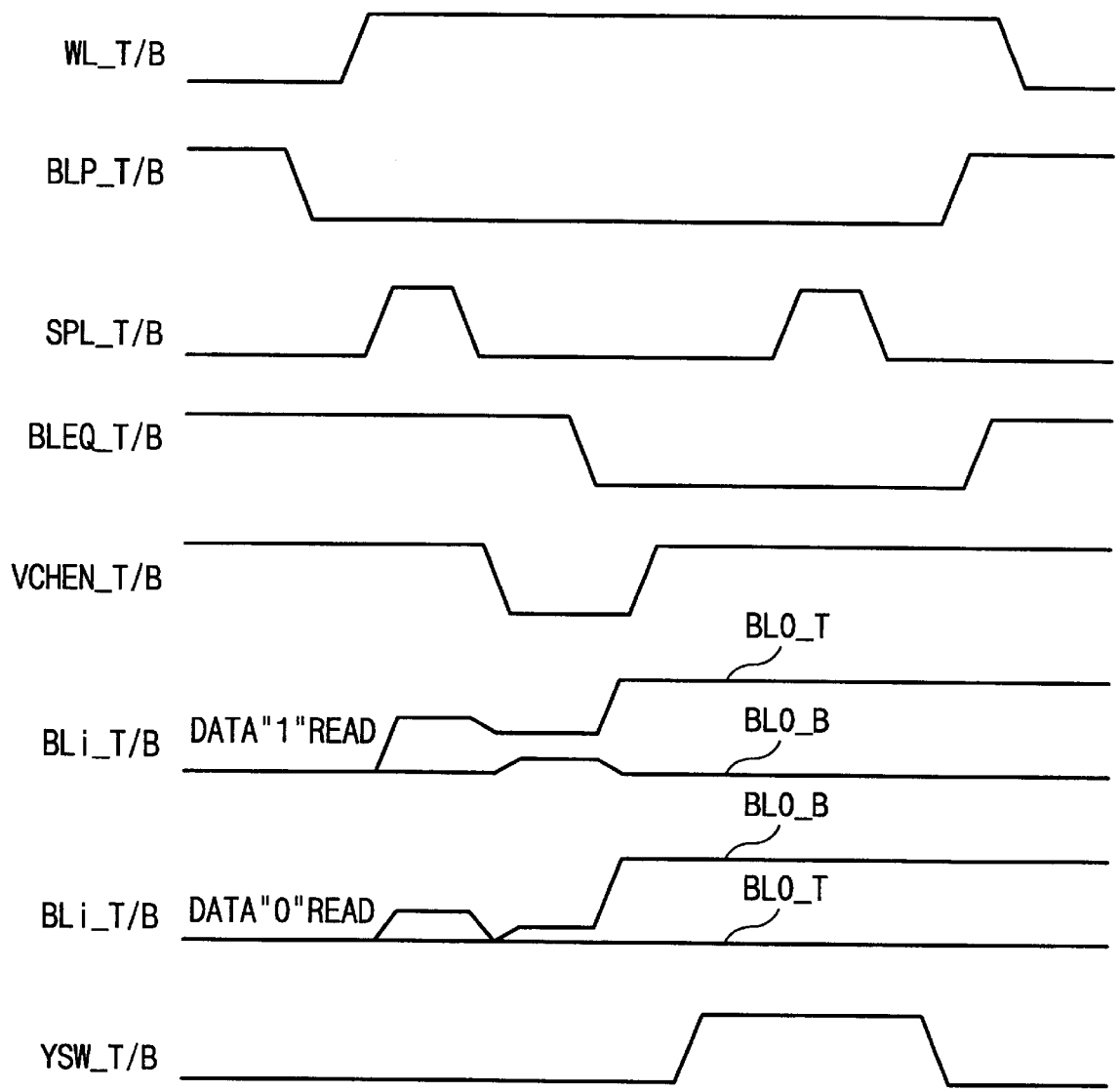
FIG. 4 is a timing diagram of the control signals used in the ferroelectric random access memory shown in FIGS. 3A–3B.

FIG. 4 is a timing diagram of the control signals used in the ferroelectric random access memory illustrated in FIGS. 3A and 3B. Assume that a memory cell MC in the first memory cell array 110 is accessed. The second memory cell array 110a and the first reference voltage supplying circuit 160 are deselected, while the first memory cell array 110 and the second reference voltage supplying circuit 160a are selected. One of the first word lines WL0_T to WLi_T corresponding to the selected first memory cell array 110 is activated.

If data stored in the selected memory cell MC is a logic "one" (a logic high), then the ferroelectric capacitor of the memory cell MC is in one polarization state. If data stored in the selected memory cell MC is a logic "zero" (a logic low), the ferroelectric capacitor thereof is in the opposite polarization state. Assume that the stored data in the selected memory cell MC is a logic one. When a first word line WLi_T is selected, an access transistor coupled to the selected first word line WLi_T is turned on. A first plate line PLi_T corresponding to the selected first word line WLi_T is also selected through the first plate line selecting circuit 120. When the first plate line driving signal SPL_T is activated, the first plate line driver 130 drives the selected first plate line PLi_T in a pulse form. Under this condition, a voltage is applied across a ferroelectric capacitor of the selected memory cell MC from the selected first plate line PLi_T to a first bit line BL0_T switching the ferroelectric capacitor from one polarization to another. After a lapse of a predetermined, the selected first plate line PLi_T is inactivated and the applied voltage is removed from the ferroelectric capacitor (no voltage is applied across the ferroelectric capacitor). At this time, a voltage on the first bit line BL0_T coupled to the selected memory cell MC is made higher than at an initial state (for example, a ground level) as shown in FIG. 4. The voltage $V_{BL1}$ on the first bit line BL0_T coupled to the selected memory cell MC having logic one data stored therein as follows.

$$V_{BL1} = \left( \frac{C_{SW}}{C_{SW} + C_{BL}} - \frac{C_{NSW}}{C_{NSW} + C_{BL}} \right) \times V_{PL} \quad (1)$$

In equation 1 $C_{SW}$ indicates the capacitance of the ferroelectric capacitor at switching, $C_{NSW}$ indicates the capacitance of the ferroelectric capacitor at non-switching, and $V_{PL}$ indicates the voltage on the plate line. $C_{BL}$ indicates the capacitance of the first bit line BL0_T. If the stored data in the selected memory cell MC is a logic zero, the voltage $V_{BL0}$ on the first bit line BL0_T is as follows.

$$V_{BL0} = \left( \frac{C_{NSW}}{C_{NSW} + C_{BL}} - \frac{C_{NSW}}{C_{NSW} + C_{BL}} \right) \times V_{PL} = 0 \quad (2)$$

When a switching control signal BLEQ_B is activated, NMOS transistors 205a and 206a of the second reference voltage supplying circuit 160a are turned on such that one plate of the coupling capacitor 208a therein is collectively coupled to the second bit lines BL0_B and BL1_B through the turned-on transistors 205a and 206a. When a switching control signal VCHEN_B is activated, reference voltages $V_{REF}$ are generated on the respective second bit lines BL0_B and BL1_B in accordance with the capacitor coupling scheme. The reference voltages $V_{REF}$ are equalized through the NMOS transistors 205a and 206a. Each of the reference voltages $V_{REF}$ will be calculated as follows.

$$V_{REF} = \frac{C_R}{C_R + 2C_{BL}} \times VCC \quad (3)$$

In equation 3, $C_{BL}$ indicates the capacitance of each of the second bit lines BL0_B and BL1_B and $C_R$ indicates the capacitance of the coupling capacitor 208a.

When the sense amplifier SA coupled commonly to the bit lines BL0_T and BL0_B is activated, the voltage $V_{BL1}$ on the first bit line BL0_T is amplified to an operating voltage, for example, a power supply voltage VCC, and the second bit line BL0_B is grounded through the sense amplifier SA. As the signals YSW_T/B are activated, the first and second bit lines BL0_T and BL0_B are coupled to corresponding IO lines IO0_T and IO0_B through the first and second IO gate circuits 150 and 150a. After a well-known rewrite operation is performed, the set of the read operation is ended.

According to the reference voltage supplying circuit of the present invention, when a power noise arises during the read operation, the voltages $V_{BL1(0)}$, $V_{REF}$ and $V_{PL}$ vibrate simultaneously. This is because the reference voltage supplying circuit 160/160a utilizes the capacitor coupling structure instead of the voltage dumping structure and because the power node N4/N2 of corresponding plate line driver 130/130a and the power node N3/N1 of corresponding reference voltage supplying circuit 160a/160 are electrically connected to each other in as short a distance as possible. This enables a difference between voltages $V_{BL1(0)}$ and $V_{REF}$ on the first and second bit lines BL0_T and BL0_B, that is, the sensing margin ($V_{MARGIN}=V_{BL1(\_)}-V_{REF(\_)}$) is maintained or stabilized even though the power noise arises during the read operation. As a result, the ferroelectric random access memory of the present invention has an improved reliability.

A preferred embodiment of the ferroelectric random access memory according to the present invention has been described by use of "an open bit line structure" well known in the art. However, it is obvious to one skilled in the art that "a folded bit line structure" can be applied to the present invention. The invention has been described using an exemplary preferred embodiment. However, it is to be understood that the scope of the invention its not limited to the disclosed embodiments. On the contrary, the description is intended to cover various modifications and similar arrangements. The scope of the claims, therefore, should be accorded the broadest interpretation thereby encompassing all such modifications and similar arrangements.

What is claimed is:

1. A random access memory device comprising:
   a word line arranged in a first direction;
   a first bit line arranged in a second direction;
   a memory cell positioned at an intersection of the word line and the first bit line;
   a second bit line arranged in the second direction;
   a sense amplifier coupled to the first and second bit lines for sensing and amplifying a voltage difference on the first and second bit lines; and
   a reference voltage supplying circuit for supplying the second bit line with a reference voltage responsive to first and second switching control signals, the reference voltage supplying circuit comprising a coupling capacitor having a first and second plates, a first switching device having a first, second, and third terminals, the first terminal being connected to the second bit line, the second terminal being connected to the first plate of the coupling capacitor, and the third terminal receiving the first switching control signal and a second switching device having a fourth, fifth, and sixth terminal, the fourth terminal being connected to the second plate of the coupling capacitor, the fifth terminal being connected to a first power node, and the sixth terminal receiving the second switching control signal, the first power node receiving a power supply voltage.

2. The random access memory device according to claim 1 wherein the first switching device is enabled prior to the second switching device.

3. The random access memory device according to claim 1 comprising:
   a plate line arranged in the first direction corresponding to the word line; and
   a plate line driver coupled to the plate line and a second power node for driving the plate line responsive to a plate line driving signal, the second power node receiving the power supply voltage, the first and second power nodes being electrically connected to each other in as short a distance as possible.

4. The random access memory device according to claim 3 wherein the memory cell comprises an access transistor having a drain coupled to the first bit line, a gate coupled to the word line, and a source and wherein the ferroelectric capacitor having a first plate coupled to the source and a second plate coupled to the plate line.

5. The random access memory device according to claim 1 wherein the coupling capacitor includes a dielectric material positioned between its electrodes that comprises a paraelectric material.

6. A random access memory device comprising:
   a word line arranged in a first direction;
   a plurality of first bit lines arranged in a second direction;
   a plurality of memory cells formed at intersections of the word line and the first bit lines;
   a plurality of second bit lines arranged in the second direction;
   a sense amplifier circuit having a plurality of sense amplifiers, each of the sense amplifiers being coupled between a corresponding one of the first bit lines and a corresponding one of the second bit lines, and each sense amplifier sensing and amplifying a voltage difference between the corresponding first and second bit lines, the corresponding second bit line having a reference voltage; and
   a reference voltage supplying circuit having a plurality of reference voltage supplying sections, each of the reference voltage supplying sections being coupled between a corresponding pair of second bit lines and supplying the corresponding pair of second bit lines with the reference voltage responsive to first and second switching control signals;
   wherein each of the reference voltage supplying sections comprises:
      a coupling capacitor;
      a first switching device for connecting one of the second bit lines of the corresponding pair of second bit lines to a first plate of the coupling capacitor responsive to the first switching control signal;
      a second switching device for connecting another of the second bit lines of the corresponding pair of second bit lines to the first plate of the coupling capacitor responsive to the first switching control signal; and
      a third switching device for connecting a second plate of the coupling capacitor to a first power node responsive to the second switching control signal, the first power node receiving a power supply voltage.

7. The random access memory device according to claim 6 wherein the first and second switching devices are activated prior to the third switching device.

8. The random access memory device according to claim 6, comprising:
   a plate line arranged in the first direction corresponding to the word line; and
   a plate line driver coupled to the plate line and a second power node for driving the plate line responsive to a plate line driving signal, the second power node receiving the power supply voltage and the first and second power nodes being electrically connected to each other in as short a distance as possible.

9. The random access memory device according to claim 8 wherein each of the memory cells comprises:
   an access transistor having a drain coupled to a corresponding first bit line, a gate coupled to the word line, and a source; and
   a ferroelectric capacitor having a first plate coupled to the source and a second plate coupled to the plate line.

10. The random access memory device according to claim 6 wherein the coupling capacitor has a dielectric between its electrodes that comprises a paraelectric material.

11. A random access memory device comprising:
    a first memory cell array including a plurality of first memory cells arranged in row and column directions;
    a second memory cell array including a plurality of second memory cells arranged in the row and column directions;
    a plurality of first word lines arranged in the row direction, each word line, being coupled to a corresponding row of memory cells in the first memory cell array;
    a plurality of second word lines arranged in the row direction, each second word line being coupled to a corresponding row of memory cells in the second memory cell array;

a plurality of first bit lines arranged in the column direction, each first bit line being coupled to a corresponding column memory cells in the first memory cell array;

a plurality of second bit lines arranged the column direction, each second bit line being coupled to memory cells in the second memory cell array;

a plurality of first plate lines coupled to the first memory cell array and corresponding to the plurality of first word lines;

a plurality of second plate lines coupled to the second memory cell array and corresponding to the plurality of second word lines;

a first plate line selecting circuit for selecting one of the first plate lines responsive to first word line driving signals;

a second plate line selecting circuit for selecting one of the second plate lines responsive to second word line driving signals;

a first plate line driver for driving the selected first plate line responsive to a first plate line driving signal;

a second plate line driver for driving the selected second plate line responsive to a second plate line driving signal;

a sense amplifier circuit including a plurality of sense amplifiers, each sense amplifier sensing and amplifying a first voltage difference between a reference voltage on a corresponding one of the first bit lines and a voltage on a corresponding one of the second bit lines and a second voltage difference between a reference voltage on a corresponding one of the second bit lines and a voltage on a corresponding one of the first bit lines;

a first reference voltage supplying circuit having a plurality of first reference voltage supplying sections, each first reference voltage supplying sections being coupled between a corresponding pair of first bit lines and supplying the corresponding pair of first bit lines with the reference voltage responsive to first and second switching control signals;

a second reference voltage supplying circuit having a plurality of second reference voltage supplying sections, each of the second reference voltage supplying sections being coupled between a corresponding pair of second bit lines and supplying the corresponding pair of second bit lines with the reference voltage responsive to third and fourth switching control signals;

wherein each of the first reference voltage supplying sections comprises a first coupling capacitor, a first switching device for connecting one of the first bit lines of the corresponding first bit line pair to a first plate of the first coupling capacitor responsive to the first switching control signal, a second switching device for connecting another of the first bit lines of the corresponding first bit line pair to the first plate of the first coupling capacitor responsive to the first switching control signal, and a third switching device for connecting a second plate of the first coupling capacitor to a first power node responsive to the second switching control signal, the first power node receiving a power supply voltage; and wherein each of the second reference voltage supplying sections comprises a second coupling capacitor, a fourth switching device for connecting one of the second bit lines of the corresponding second bit line pair to a first plate of the second coupling capacitor responsive to the third switching control signal, a fifth second switching device for connecting the other of the second bit lines of the corresponding second bit line pair to the first plate of the second coupling capacitor responsive to the third switching control signal, and a sixth switching device for connecting a second plate of the second coupling capacitor to a second power node responsive to the fourth switching control signal, the second power node receiving the power supply voltage.

12. The random access memory device according to claim 11, wherein the first switching control signal is activated prior to the second switching control signal, and the third switching control signal is activated prior to the fourth switching control signal.

13. The random access memory device of claim 11, wherein each of the memory cells of the respective first and second memory cell arrays comprises:

a ferroelectric capacitor having a first plate coupled to a corresponding plate line and a second terminal; and an access transistor having a current path formed between a corresponding bit line and a second plate of the ferroelectric capacitor and a gate coupled to a corresponding word line.

14. The random access memory device of claim 11, wherein the first plate line selecting circuit comprises a plurality of field effect transistors each having a current path coupled between the first plate line driver and a corresponding first plate line and a gate coupled to a corresponding first word line and wherein the second plate line selecting circuit comprises a plurality of field effect transistors, each having a current path coupled between the second plate line driver and a corresponding second plate line and a gate coupled to a corresponding second word line.

15. A random access memory device comprising:

a word line arranged in a first direction;

a first bit line arranged in a second direction;

a memory cell positioned at an intersection of the word line and the first bit line;

a second bit line arranged in the second direction;

a sense amplifier coupled to the first and second bit lines for sensing and amplifying a voltage difference on the first and second bit lines; and a reference voltage supplying circuit adapted to supply the second bit line with a reference voltage responsive to the first and second switching control signals, the reference voltage supplying circuit comprising:

a coupling capacitor having a first and second plates;

a first switching device having a first channel and a first input terminal receiving a first switching control signal, the first channel coupling the first plate of the coupling capacitor to a power node responsive to the first switching control signal, the power node receiving a power supply voltage;

a second switching device having a second channel and a second input terminal receiving a second switching control signal, the second channel coupling the first bit line to the second plate of the coupling capacitor responsive to the second switching control signal;

a third switching device having a third channel and a third input terminal receiving the second switching control signal, the third channel coupling the second bit line to the second plate of the coupling capacitor responsive to the second switching control signal.

* * * * *

UNITED STATES PATENT AND TRADEMARK OFFICE
CERTIFICATE OF CORRECTION

PATENT NO.    : 6,295,223 B1
DATED         : September 25, 2001
INVENTOR(S)   : Choi et al.

It is certified that error appears in the above-identified patent and that said Letters Patent is hereby corrected as shown below:

<u>Title page,</u>
Item [54], in the title, "MEMORY WITH A MEMORY WITH A STABLE" should read -- MEMORY WITH A STABLE --.

<u>Column 1,</u>
Line 52, "polarization sense" should read -- polarization state --.
Line 52, "Generally, the" should read -- Generally, this --.

Signed and Sealed this

Tenth Day of December, 2002

JAMES E. ROGAN
*Director of the United States Patent and Trademark Office*